United States Patent
Bonart

(10) Patent No.: US 6,680,503 B2
(45) Date of Patent: Jan. 20, 2004

(54) FIELD-EFFECT TRANSISTOR STRUCTURE WITH AN INSULATED GATE

(75) Inventor: Dietrich Bonart, München (DE)

(73) Assignee: Infineon Technologies AG, Munich (DE)

( * ) Notice: Subject to any disclaimer, the term of this patent is extended or adjusted under 35 U.S.C. 154(b) by 31 days.

(21) Appl. No.: 09/853,474

(22) Filed: May 11, 2001

(65) Prior Publication Data

US 2001/0041399 A1 Nov. 15, 2001

(30) Foreign Application Priority Data

May 11, 2000 (DE) ......................... 100 23 116

(51) Int. Cl.[7] ............................. H01L 27/108
(52) U.S. Cl. ................ 257/297; 257/407; 438/197; 438/259; 438/292
(58) Field of Search ............... 438/197, 199, 438/142, 207, 217, 220, 227, 264, 979, 151, 154, 167, 169, 170, 176, 186, 187, 189, 201, 202, 211, 257, 265, 587, 927; 257/294, 328, 349, 351, 372, 401, 635, 629, 67, 134, 153, 172, 204, 256, 249, 250, 288, 314, 316, 322, 327, 329, 346, 364, 388, 483, 761

(56) References Cited

U.S. PATENT DOCUMENTS

| | | | | |
|---|---|---|---|---|
| 4,366,614 A | * | 1/1983 | Kumurdjian | ............... 438/483 |
| 5,750,435 A | * | 5/1998 | Pan | ............... 438/525 |
| 6,165,822 A | * | 12/2000 | Okuno et al. | ............... 438/142 |
| 6,195,292 B1 | * | 2/2001 | Usuki et al. | ........... 365/185.28 |
| 6,284,582 B1 | * | 9/2001 | Yu | ............... 438/202 |

OTHER PUBLICATIONS

Mattheiss, L.F.; Band Structures of Transistion Metal Dichalcogenides Layer Compounds; Physiscal Review B, vol. 8, No. 8, 1973, pp. 3719–3740.*

D.A. Grant et al.:"Power MOSFETs—Theory and Applications", Wiley & Sons, 1989, pp. 28–37.

Y. Omura: "Two–Dimensional Quantization Effect on Indirect Tunneling in an Insulated Gate Lateral pn–Junction Structure with a Thin Silicon Layer", Jpn. J. Appl. Phys., vol. 39 (Apr. 2000), pp. 1597–1603, Part 1, No. 4A.

* cited by examiner

Primary Examiner—George Fourson
Assistant Examiner—Julio J. Maldonado
(74) Attorney, Agent, or Firm—Laurence A. Greenberg; Werner H. Stemer; Ralph E. Locher

(57) ABSTRACT

The field-effect transistor has an insulated gate, a source electrode, a drain electrode, and an inversion channel between the source and drain electrodes and underneath the gate electrode. The gate electrode is fabricated from a material which does not have a permitted energy state in the energy interval which is used to control the charge carrier density in the inversion channel between the source electrode and the drain electrode.

5 Claims, 2 Drawing Sheets

Tunneling Possible

No Tunneling

FIELD-EFFECT TRANSISTOR STRUCTURE WITH AN INSULATED GATE

BACKGROUND OF THE INVENTION

Field of the Invention

The invention relates to a field-effect transistor structure in which the gate electrode is separated by an insulation layer from an inversion channel in the semiconductor layer lying underneath. The invention relates, in particular, to a silicon-based field-effect transistor of this type, wherein a $SiO_2$ layer is used as the insulation layer.

A field-effect transistor is a semiconductor component with three terminals which are referred to as the gate, source and drain. In a field-effect transistor, the conductivity of the drain-source path is influenced with a control voltage applied to the gate, during which process no control current flows so that the control is carried out without any consumption of power. By means of the control voltage applied to the gate which is insulated from the drain-source path by means of an insulation layer, the charge carrier density is determined in the inversion layer which is located underneath the gate and forms a conductive channel between the drain and the source, thus permitting current flow. Without such an inversion layer, at least one of the pn-type junctions between the source and the semiconductor substrate or the drain and the semiconductor substrate is always switched off so that no current flows in the field-effect transistor. Depending on the doping of the channel in the semiconductor substrate between the drain and the source, the field-effect transistor is normally on or normally off. In the case of normally on field-effect transistors, a drain current flows without a voltage being applied between the drain and the source, whereas it does not flow in normally off field-effect transistors.

Such field-effect transistors with an insulated gate, also referred to in the following as MISFET or as a MOSFET if an oxide is used as the insulation layer, are used in particular as an active component in highly integrated silicon-based circuits because field-effect transistors can be fabricated very easily and in a very space-saving way. Here, in particular, field-effect transistors in which the insulation layer is composed of $SiO_2$ and the gate electrode of polysilicon have become customary. Polysilicon can be deposited at relatively low temperatures and also be made highly conductive by doping. Furthermore, a polysilicon can be precisely structured using a dry etching process.

The insulation layers between the gate and the inversion channel in the semiconductor substrate are being made increasingly thin by means of the increasing miniaturization of the MISFET structures in integrated circuits. In the known MISFET structures, there is then however an amplified tunnel current which is caused by the fact that charge carriers of the inversion layer, which is formed underneath the gate electrode by the control voltage applied via the gate, penetrate the potential wall formed by the insulation layer. The tunnel current depends exponentially on the thickness of the insulation layer between the gate and the channel. No MISFET structures have been known hitherto in the prior art in which this undesired tunnel current can be suppressed.

SUMMARY OF THE INVENTION

The object of the present invention is to provide a field-effect transistor with an insulated gate which overcomes the above-noted deficiencies and disadvantages of the prior art devices and methods of this general kind, and in which a tunnel current composed of charge carriers from the inversion layer under the gate electrode through the insulation layer is significantly reduced.

With the above and other objects in view there is provided, in accordance with the invention, a field-effect transistor, comprising:

a source electrode and a drain electrode formed in a semiconductor substrate;

an inversion channel formed in the semiconductor substrate between the source electrode and the drain electrode, the inversion channel having a given energy interval for controlling a charge carrier density in the inversion channel;

a gate electrode disposed between the source electrode and the drain electrode and fabricated from a material having no energetically permitted state in a range of the given energy interval; and an insulation layer separating the gate electrode from the inversion channel.

In other words, the gate electrode which is separated from a channel between a source electrode and a drain electrode in a semiconductor substrate by an insulation layer is composed of a material which does not have any permitted states in an energy interval which is used to control the charge carrier density in the inversion channel.

By means of this configuration of the field-effect transistor, direct tunneling of the charge carriers from the source-drain channel into the gate electrode is significantly suppressed because the charge carriers which tunnel from the semiconductor substrate through the insulation layer do not find any permitted states in the gate electrode. Direct tunneling from the inversion channel in the semiconductor substrate into the gate electrode is thus not possible. For this reason, charge carriers can find free states in the gate electrode only by involving phonons which are excited in the gate electrode. The probability of such phonon-assisted tunneling is, however, very low so that this results in only a negligible tunnel current, even with very thin insulation layers. According to the invention, the field-effect transistor is therefore controlled virtually without the consumption of power even with a very thin insulation layer. This is advantageous in particular if the highly integrated circuits which are equipped with such field-effect transistors are operated with battery support, for example in laptops.

In accordance with an added feature of the invention, the gate electrode is formed from a material with a crystalline structure, and the material has a band gap in the given energy interval that is used to control the charge carrier density in the inversion channel between the source and the gate.

In accordance with an additional feature of the invention, the band gap of the gate electrode comprises an energy level of a basic state of the charge carriers in the inversion channel between the source electrode and the drain electrode.

In accordance with another feature of the invention, the gate electrode is formed of a material having a band gap in an electronic band structure in an energy range of up to 2 eV above the Fermi level.

According to this preferred embodiment, the gate electrode is composed of a material with a crystalline structure which has a band gap in the band structure in the energy interval in the range up to 2 eV above the Fermi level. This configuration of the gate electrode makes it possible to reliably prevent elastic tunneling of charge carriers through the insulation layer in the energy range which comprises the voltage differential which is used to control the charge carrier density and is usually applied between the gate electrode and the source electrode.

In accordance with a concomitant feature of the invention, the semiconductor substrate is a silicon semiconductor substrate, and the gate electrode is formed of 2H-TaS$_2$.

In this preferred embodiment, an n-type channel is formed in a silicon layer between the source electrode and the drain electrode, 2H-TaS$_2$ being used as the material for the gate electrode. This configuration makes it possible largely to suppress direct tunneling in standard silicon-based MISFETs so that the semiconductor structure according to the invention can be fabricated with the known silicon planar technology.

Other features which are considered as characteristic for the invention are set forth in the appended claims.

Although the invention is illustrated and described herein as embodied in a field-effect transistor structure with an insulated gate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Transistors are controllable semiconductor components which are used as amplifiers for electronic circuits for generating oscillations, and in special embodiments, for example as radiation detectors. When such transistors are used in highly integrated circuits, it has become the practice to use, in particular, field-effect transistors in which the conductivity of a current-conducting channel in a semiconductor substrate, and thus the current flowing through, is changed by means of an electrical field. The field is generated by a control electrode, the so-called gate, which is separated by an insulation layer from a channel which extends between an input electrode, referred to as the source, and an output electrode, referred to as the drain. The channel in the semiconductor substrate may be p-type conductive or n-type conductive depending on the doping of the source and drain electrodes and/or the semiconductor layer lying between them.

Such field-effect transistors can be easily fabricated with small dimensions so that they are suitable for use in highly integrated circuits. Here, in particular, field-effect transistors with an insulated metal gate, referred to as MISFETs, which are preferably constructed on a silicon base with a SiO$_2$ layer as the insulator, have become customary. Such MISFETs can be implemented easily and cost-effectively as part of an integrated circuit using silicon planar technology.

Figure 1:
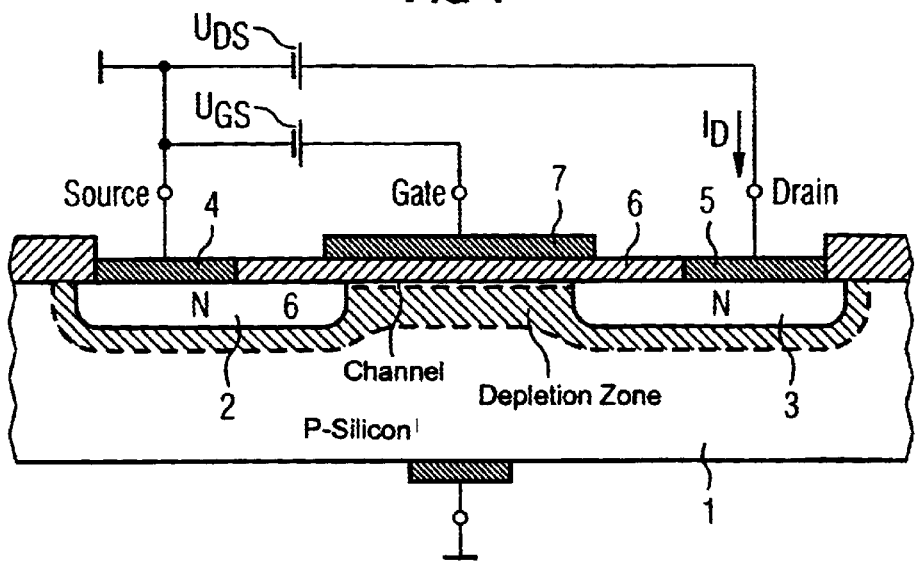
FIG. 1 is a schematic cross section taken through an n-type channel MISFET.

Referring now to the figures of the drawing in detail and first, particularly, to FIG. 1 thereof, there is seen a schematic view of a cross section through an n-type channel MISFET. Two highly conductive n-type regions 2, 3 are diffused into the p-type conductive silicon base material 1. These n-type regions 2, 3 are placed in contact with metal layers and are used as a current-supplying source electrode 4 and a current-absorbing drain electrode 5. An insulation layer 6, preferably composed of SiO$_2$, is applied between the metal contacts of the source electrode 4 and the drain electrode 5. A metallic layer is formed, as gate electrode 7, on the insulation layer 6. By applying a voltage U$_{GS}$ to the gate electrode 7 opposite the Si substrate 1, the electron density in the region between the two highly conductive n-type regions 2, 3 of the source electrode 4 and of the drain electrode 5 is increased as a result. An n-type conductive channel is thus produced between the n-type regions 2, 3, with the result that, when a voltage U$_{DS}$ is applied between the drain electrode 5 and the source electrode 4, a current I$_D$ flows. In the known MISFETs, a metal, in particular aluminum or polycrystalline silicon, is used as the gate electrode. The use of polysilicon has the advantage that it can be deposited on the SiO$_2$ layer at low temperatures using planar technology; the structure becomes highly conductive, i.e. metallic, as a result of doping.

Figure 2:
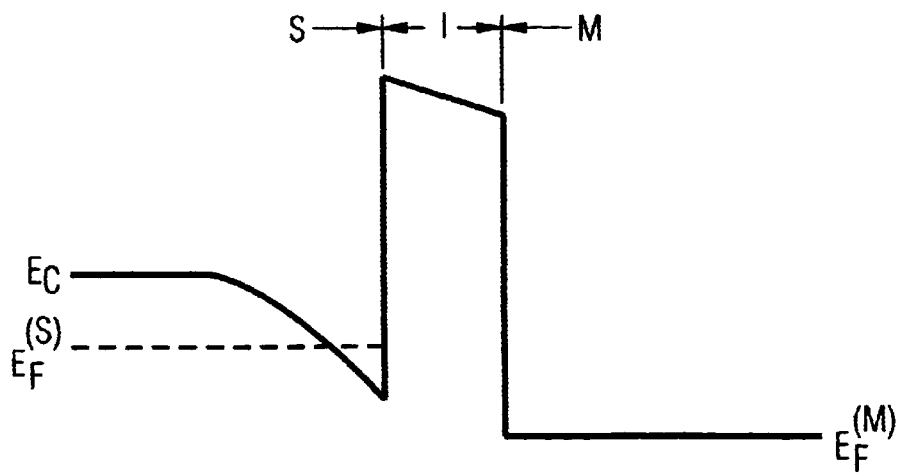
FIG. 2 is a band diagram of an n-type channel MISFET with the formation of an inversion layer.

FIG. 2 shows a schematic view of a band diagram of an n-type channel MISFET with a layer structure composed of a p-type doped substrate (S), insulation layer (I) and a metallic gate electrode (M). The band diagram is a description of the electronic spectrum in a solid by means of energy bands. The energy spectrum of the electrons is determined by the band structure of the solid. In metallic solids, the Fermi level E$_F$, which indicates that all the energy states below this energy level are occupied, lies in a permitted energy band. On the other hand, in non-metals this Fermi level E$_F$ lies in an energy range in which there is a gap between the energy bands. In non-metals, the valence bands lie below the band gap and the conduction bands lie above it.

FIG. 2 shows the profile of the conduction band in a MISFET in which an inversion layer is formed in the semiconductor substrate underneath the gate electrode by applying a control voltage to the gate so that current is conducted in the MISFET between the source electrode and the drain electrode. By means of the control voltage applied to the gate, the conduction band edge at the junction between the p-type semiconductor substrate S and the insulation layer I is pulled below the Fermi level E$_F$ so that an n-type conductive inversion layer is formed at the boundary between the semiconductor substrate S and the insulation layer I. However, because the conduction band edge in the insulator I continues to be located above the Fermi level E$_F$, and there is thus a potential wall between the semiconductor substrate S and the gate electrode M, a flow of current between the n-type channel in the semiconductor substrate and the gate electrode is substantially prevented so that the MISFET is controlled largely without consumption of power.

However, owing to the tunnel effect in conventional MISFETs there flows a small current between the n-type channel and the gate electrode. This tunnel effect is due to the fact that electrons can penetrate the potential wall of the insulator. The intensity of the tunnel current depends not only on the level of the potential wall but also substantially on the thickness of the insulation layer. Furthermore, for the intensity of the tunnel current it is decisive that the tunneling electrons from the n-type channel in the semiconductor substrate S find energetically permitted states in the gate electrode M. Only then is what is referred to as elastic tunneling of the electrons actually possible.

Figure 3:
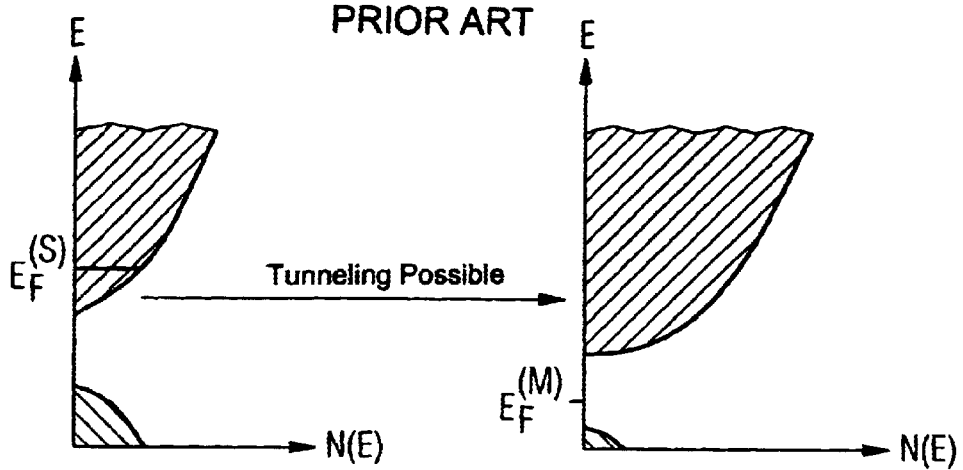
FIG. 3 is a diagrammatic graph of a tunnel process in a prior art field-effect transistor.

In polysilicon or aluminum, which are conventionally used as the gate material, such permitted energetic states for the tunneling electrons occur up to 3 eV in the range of the control voltages used in MISFETs. FIG. 3 shows a schematic view of the profile of the thickness of the energetically permitted states N(E) in a gate electrode composed of polysilicon. It is clearly apparent here that the basic state of the electrons in the n-type channel in the semiconductor substrate coincides with an energetically permitted state in the gate electrode. This means that elastic tunneling of the electrons out of the n-type channel is possible. Because the thickness of the insulation layer I is being continuously reduced owing to the increasing miniaturization of MISFETs in highly integrated circuits, these loss currents caused by elastic tunneling are becoming increasingly problematic. This is particularly problematic in battery-supported applications of such highly integrated circuits.

Figure 4:
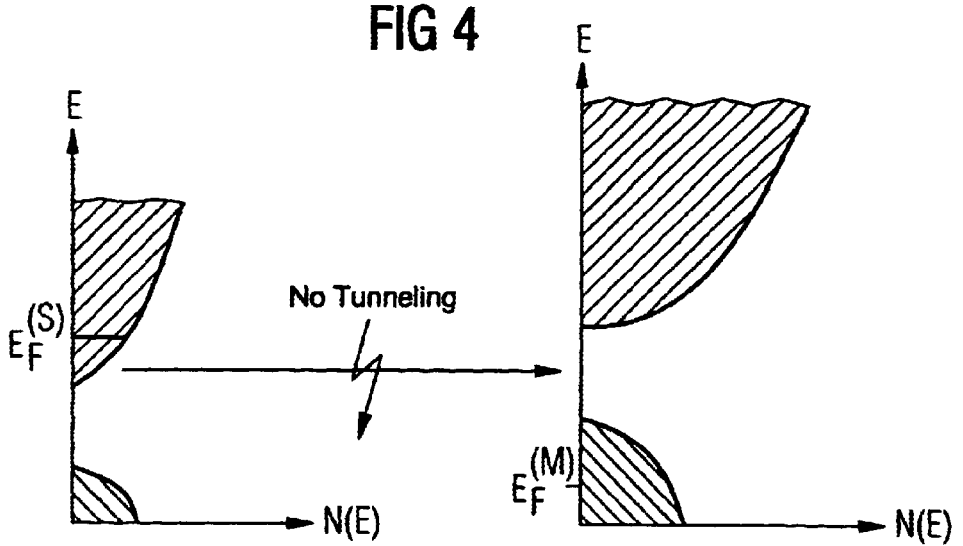
FIG. 4 is a diagrammatic graph of a suppressed tunnel process in a field-effect transistor according to the invention.

In order to reduce to a substantial degree the elastic tunnel currents from the inversion channel into the gate electrode in MISFETs, according to the invention a material is used for the gate electrode which does not have any energetically permitted states in the range of the energy interval which is used for controlling the charge carrier density in the inversion channel between the gate electrode and the source electrode, so that elastic tunneling between the inversion layer in the semiconductor substrate and the gate electrode through the potential wall of the insulation layer is not possible. With respect to such a design, FIG. 4 shows a schematic view of the state density N(E) in the material used for the gate electrode M.

It is clearly apparent here that in the range of the voltage differential which is applied between the gate electrode M and the semiconductor substrate S there are no energetically permitted states, in particular for electrons which are located at the base level in the inversion channel in the semiconductor substrate. The electrons from the inversion channel between the source electrode and the drain electrode in the semiconductor substrate can therefore only pass into energetically permitted states in the gate electrode M by means of phonon-supported tunneling. The probability of such inelastic tunneling involving phonon scattering processes is, however, significantly lower than that of elastic, i.e. direct tunneling, so that even with very thin insulation layers I there is essentially no loss current between the semiconductor substrate S and the gate electrode M through the insulation layer.

In an n-type channel MISFET in which silicon is used as a semiconductor substrate and which is operated with a supply voltage of 1.5 V, preferably $2H-TaS_2$ is used as the gate electrode material. The metal $2H-TaS_2$ has, as is described in the article by L. F. Mattheiss in Phys. Rev. Volume 8, 3719 (1973), a gap in its electronic band structure in the range from 1 eV to 2 eV above the Fermi level $E_F$ so that direct tunneling of electrons out of the n-type channel is not possible with a gate electrode fabricated from $2H-TaS_2$.

The invention can be used in all types of field-effect transistors, not only the illustrated n-type channel MISFET but also in p-type channel MISFETs, as well as with normally on and normally off field-effect transistors. At the same time, apart from $SiO_2$ it is also possible to use some other dielectric material for the insulation layer between the semiconductor substrate with the inversion channel and the gate electrode.

The features of the invention disclosed in the description above, the drawings and the claims can also be of significance either individually or in any desired combination for the implementation of the invention in its various embodiments.

I claim:

1. A field-effect transistor with an insulated gate, comprising:

a semiconductor substrate;

a source electrode and a drain electrode formed in said semiconductor substrate;

an inversion channel formed in said semiconductor substrate between said source electrode and said drain electrode, said inversion channel having a given energy interval for controlling a charge carrier density in said inversion channel;

a gate electrode disposed between said source electrode and said drain electrode and fabricated from a material having no energetically permitted state in a range of the given energy interval, said inversion channel being formed underneath said gate electrode in the presence of a control voltage on said gate electrode; and an insulation layer separating said gate electrode from said inversion channel.

2. The field-effect transistor according to claim 1, wherein said gate electrode is formed from a material with a crystalline structure, and said material has a band gap in the given energy interval.

3. The field-effect transistor according to claim 2, wherein the band gap of said gate electrode comprises an energy level of a basic state of the charge carriers in said inversion channel between said source electrode and said drain electrode.

4. The field-effect transistor according to claim 1, wherein said gate electrode is formed of a material having a band gap in an electronic band structure in an energy range of up to 2 eV above the Fermi level.

5. The field-effect transistor according to claim 4, wherein said semiconductor substrate is a silicon semiconductor substrate, and said gate electrode is formed of $2H-TaS_2$.

\* \* \* \* \*